United States Patent
Schroers et al.

(10) Patent No.: US 11,621,686 B2
(45) Date of Patent: Apr. 4, 2023

(54) GRAY ZONE PREVENTION CIRCUIT WITH INDIRECT SIGNAL MONITORING

(71) Applicant: Infineon Technologies AG, Neubiberg (DE)

(72) Inventors: Christoph Schroers, Villach (AT); Carlos Humberto Garcia Rojas, Villach (AT); Elisa Sanfilippo, Villach (AT); Veikko Summa, Villach (AT)

(73) Assignee: Infineon Technologies AG, Neubiberg (DE)

( * ) Notice: Subject to any disclaimer, the term of this patent is extended or adjusted under 35 U.S.C. 154(b) by 130 days.

(21) Appl. No.: 17/158,213

(22) Filed: Jan. 26, 2021

(65) Prior Publication Data

US 2022/0239267 A1 Jul. 28, 2022

(51) Int. Cl.
*H03G 3/30* (2006.01)
*H03K 5/24* (2006.01)
*H03F 3/04* (2006.01)

(52) U.S. Cl.
CPC ............ *H03G 3/30* (2013.01); *H03F 3/04* (2013.01); *H03K 5/24* (2013.01); *H03G 2201/103* (2013.01)

(58) Field of Classification Search
CPC .. H03G 3/30; H03G 2201/103; H03G 1/0088; H03G 1/0023; H03G 3/3042; H03G 3/45098; H03F 3/04; H03F 3/45; H03F 3/45183; H03F 3/45071; H03F 1/34; H03K 5/24
USPC .................................................. 330/254, 278
See application file for complete search history.

(56) References Cited

U.S. PATENT DOCUMENTS

| | | | | | |
|---|---|---|---|---|---|
| 6,801,419 | B2* | 10/2004 | Fukui | .............. | G05F 1/573 361/93.1 |
| 6,998,826 | B2* | 2/2006 | Fukui | .............. | G05F 1/573 323/282 |
| 8,040,118 | B2* | 10/2011 | Cho | .............. | G05F 1/565 323/275 |
| 8,547,079 | B2* | 10/2013 | Socheat | .............. | G05F 1/575 323/275 |
| 2009/0206807 | A1* | 8/2009 | Imura | .............. | G05F 1/573 323/277 |
| 2015/0229124 | A1* | 8/2015 | Kim | .............. | G05F 1/571 361/86 |

* cited by examiner

*Primary Examiner* — Khanh V Nguyen
(74) *Attorney, Agent, or Firm* — Harrity & Harrity, LLP

(57) ABSTRACT

A gray zone prevention circuit includes: a first gain stage circuit including a first input terminal and a first output terminal, the first gain stage circuit amplifies a feedback signal received at the first input terminal and generates an amplified signal at the first output terminal; a second gain stage circuit including a terminal that is coupled to the first output terminal for receiving the amplified signal and a second output terminal, where the second gain stage circuit is configured to generate a monitored signal based on the amplified signal; a feedback circuit coupled between the second output terminal and the first input terminal and configured to convert the monitored signal into the feedback signal; and a comparator circuit including a monitoring node coupled to the first output terminal for receiving the amplified signal, wherein the comparator circuit is configured to monitor the monitored signal indirectly via the amplified signal.

20 Claims, 3 Drawing Sheets

GRAY ZONE PREVENTION CIRCUIT WITH INDIRECT SIGNAL MONITORING

BACKGROUND

In integrated circuits, it is often necessary to detect whether internal signals are within the specified range (i.e., a critical range) or tolerance window defined by an upper range limit and a lower range limit. In such a set up, it is desirable that an internal signal remains within the bounds of the specified range and not enter a gray zone. Two comparators may be used to observe an internal signal, one of which monitors an upper reference threshold (e.g., upper ref) and the other of which monitors a lower reference threshold (e.g., lower ref).

However, to ensure that a violation of the specified range can be detected, the reference thresholds "upper ref" and "lower ref" have to be positioned within the specified range. In other words, both reference thresholds are not set at the upper range limit and the lower range limit of the specified range, respectively, but inside that specified range. As a consequence, the upper reference threshold is less than the upper range limit and the lower reference threshold is greater than the lower range limit. The need for setting the reference (comparator) thresholds within the specified range arises from the manufacturing tolerances of the two comparators in mass production. Those manufacturing tolerances need to be taken into account to ensure a comparator is not monitoring for values outside the specified range (which would result in a "gray zone"). In other words, ranges outside of the critical range may be qualify as being a gray zone if a comparator threshold lies outside of the critical range. Thus, a gray zone refers to an instance where a signal is outside of its critical range but a comparator has not triggered because its threshold has not been reached by the signal. Thus, a gray zone is the zone between the signals upper/lower range critical limit and the upper/lower comparator threshold, if the comparator threshold lies outside of the allowed critical range of the monitored signal. Ensuring a comparator is not monitoring for values outside the specified critical range poses hard accuracy requirements on the accuracy of the comparators and the reference thresholds "upper ref" and "lower ref" which in turn leads to a large chip area (for matching reasons).

Therefore, an improved monitoring device that enables relaxed accuracy requirements on the accuracy of the comparators may be desirable. Such a monitoring device may further allow the use of smaller comparators, which saves chip area and cost.

SUMMARY

Embodiments provide a gray zone prevention circuit that includes: a first gain stage circuit including a first input terminal and a first output terminal, wherein the first gain stage circuit amplifies a feedback signal received at the first input terminal and generates an amplified signal at the first output terminal; a second gain stage circuit including a terminal and a second output terminal, wherein the terminal is coupled to the first output terminal for receiving the amplified signal, wherein the second gain stage circuit is configured to generate a monitored signal at the second output terminal based on the amplified signal; a feedback circuit coupled between the second output terminal and the first input terminal and configured to convert the monitored signal into the feedback signal; and a comparator circuit including a monitoring node coupled to the first output terminal for receiving the amplified signal, wherein the comparator circuit is configured to monitor the monitored signal indirectly via the amplified signal.

Embodiments further provide a method of preventing a monitored signal from entering a gray zone. The method includes amplifying, by a first gain stage circuit, a feedback signal in order to generate an amplified signal; generating, by a second gain stage circuit, the monitored signal based on the amplified signal; converting, by a feedback circuit, the monitored signal into the feedback signal to be provided to the first gain stage circuit; and monitoring, by a comparator circuit, the monitored signal indirectly via the amplified signal.

BRIEF DESCRIPTION OF THE DRAWINGS

Embodiments are described herein making reference to the appended drawings.

DETAILED DESCRIPTION

Figure 1:
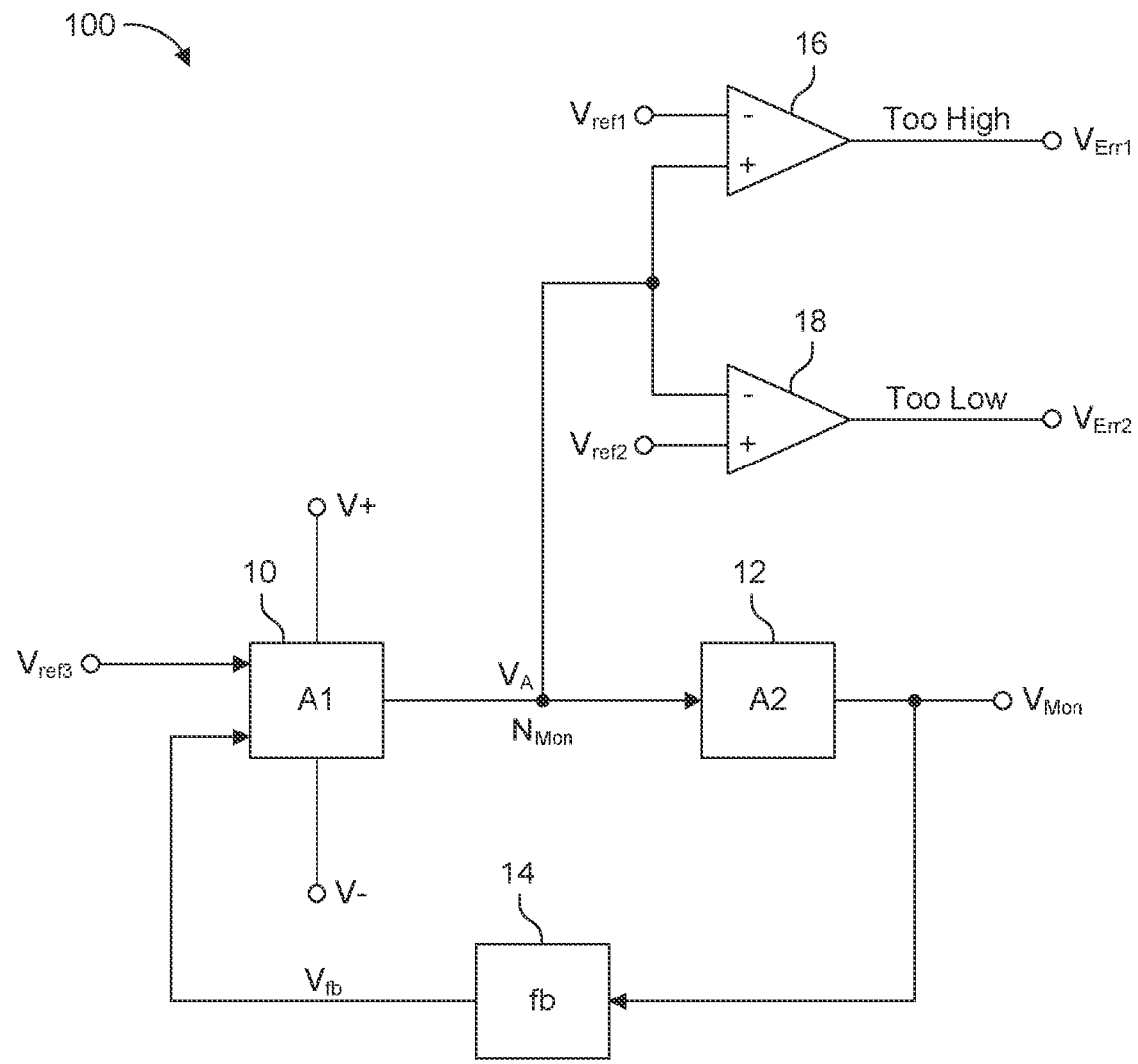
FIG. 1 is a schematic diagram of a signal monitoring circuit according to one or more embodiments.

In the following, details are set forth to provide a more thorough explanation of the exemplary embodiments. However, it will be apparent to those skilled in the art that embodiments may be practiced without these specific details. In other instances, well-known structures and devices are shown in block diagram form or in a schematic view rather than in detail in order to avoid obscuring the embodiments. In addition, features of the different embodiments described hereinafter may be combined with each other, unless specifically noted otherwise.

Further, equivalent or like elements or elements with equivalent or like functionality are denoted in the following description with equivalent or like reference numerals. As the same or functionally equivalent elements are given the same reference numbers in the figures, a repeated description for elements provided with the same reference numbers may be omitted. Hence, descriptions provided for elements having the same or like reference numbers are mutually exchangeable.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

In embodiments described herein or shown in the drawings, any direct electrical connection or coupling, i.e., any connection or coupling without additional intervening elements, may also be implemented by an indirect connection or coupling, i.e., a connection or coupling with one or more additional intervening elements, or vice versa, as long as the general purpose of the connection or coupling, for example, to transmit a certain kind of signal or to transmit a certain kind of information, is essentially maintained. Features from different embodiments may be combined to form further embodiments. For example, variations or modifications described with respect to one of the embodiments may also be applicable to other embodiments unless noted to the contrary.

The term "substantially" may be used herein to account for small manufacturing tolerances (e.g., within 5%) that are deemed acceptable in the industry without departing from the aspects of the embodiments described herein.

In the present disclosure, expressions including ordinal numbers, such as "first", "second", and/or the like, may modify various elements. However, such elements are not limited by the above expressions. For example, the above expressions do not limit the sequence and/or importance of the elements. The above expressions are used merely for the purpose of distinguishing an element from the other elements. For example, a first box and a second box indicate different boxes, although both are boxes. For further example, a first element could be termed a second element, and similarly, a second element could also be termed a first element without departing from the scope of the present disclosure.

One or more aspects of the present disclosure may be implemented as a non-transitory computer-readable recording medium having recorded thereon a program embodying methods/algorithms for instructing the processor to perform the methods/algorithms. Thus, a non-transitory computer-readable recording medium may have electronically readable control signals stored thereon, which cooperate (or are capable of cooperating) with a programmable computer system such that the respective methods/algorithms are performed. The non-transitory computer-readable recording medium can be, for example, a CD-ROM, DVD, Blu-ray disc, a RAM, a ROM, a PROM, an EPROM, an EEPROM, a FLASH memory, or an electronic memory device.

Each of the elements of the present disclosure may be configured by implementing dedicated hardware or a software program on a memory controlling a processor to perform the functions of any of the components or combinations thereof. Any of the components may be implemented as a central processing unit (CPU) or other processor reading and executing a software program from a recording medium such as a hard disk or a semiconductor memory device. For example, instructions may be executed by one or more processors, such as one or more CPUs, digital signal processors (DSPs), general-purpose microprocessors, application-specific integrated circuits (ASICs), field programmable logic arrays (FPGAs), programmable logic controller (PLC), or other equivalent integrated or discrete logic circuitry.

Accordingly, the term "processor," as used herein refers to any of the foregoing structures or any other structure suitable for implementation of the techniques described herein. Thus, the techniques described in this disclosure may be implemented, at least in part, in hardware, software, firmware, or any combination thereof. For example, various aspects of the described techniques may be implemented within one or more processors, including one or more microprocessors, DSPs, ASICs, or any other equivalent integrated or discrete logic circuitry, as well as any combinations of such components.

A controller including hardware may also perform one or more of the techniques of this disclosure. A controller, including one or more processors, may use electrical signals and digital algorithms to perform its receptive, analytic, and control functions, which may further include corrective functions. Such hardware, software, and firmware may be implemented within the same device or within separate devices to support the various techniques described in this disclosure. Software may be stored on a non-transitory computer-readable medium such that the non-transitory computer readable medium includes a program code or a program algorithm stored thereon which, when executed, causes the controller, via a computer program, to perform the steps of a method.

A signal processing circuit and/or a signal conditioning circuit may receive one or more signals from one or more components and perform signal conditioning or processing thereon. Signal conditioning, as used herein, refers to manipulating a signal in such a way that the signal meets the requirements of a next stage for further processing. Signal conditioning may include converting from analog to digital (e.g., via an analog-to-digital converter), amplification, filtering, converting, biasing, range matching, isolation and any other processes required to make a signal suitable for processing after conditioning.

Thus, a signal processing circuit may include an analog-to-digital converter (ADC) that converts the analog signal from the one or more sensor elements to a digital signal. The signal processing circuit may also include a digital signal processor (DSP) that performs some processing on the digital signal.

FIG. 1 is a schematic diagram of a signal monitoring circuit 100 according to one or more embodiments. In this example, the signal monitoring circuit 100 is used to indirectly monitor a monitored voltage Vmon. The signal monitoring circuit 100 includes a first gain stage 10 and a second gain stage 12 that are electrically coupled together. The first gain stage 10 has a first gain A1 and the second gain stage 12 has a second gain A2 that may be different from the first gain A1. In particular, the first gain A1 may be greater than the second gain A2. For example, the first gain A1 may be at least an order of magnitude greater than the second gain A2, and may be at least two orders of magnitude greater than the second gain A2, and may be at least three orders of magnitude greater than the second gain A2. The greater the difference between gains A1 and A2, the more the accuracy requirements on the comparators 16 and 18 can be relaxed, to be discussed below. However, more generally, the higher the gain of A1, the more inaccurate comparators 16 and 18 can be. In this sense, it is possible to disregard the gain value of A2 since the second gain stage 12 is not in the detection feedback loop. In this way, the value of gain A1 works in combination with the accuracy of the comparators 16 and 18. It can be said that the value of gain A1 is inversely related (e.g., inversely proportional) to the accuracy of the comparators 16 and 18. When the gain A1 is low, the accuracy requirement for comparators 16 and 18 increases. When the gain A1 is high, the accuracy requirement for comparators 16 and 18 decreases.

The second gain stage 12 generates the monitored voltage Vmon at its output terminal. In particular, the monitored voltage Vmon is produced and regulated by a feedback loop. Thus, signal monitoring circuit 100 includes the two different gain stages 10 and 12 that generate an output voltage (i.e., monitored voltage Vmon) that is regulated by a feedback loop. Accordingly, the signal monitoring circuit 100 is suitable for use in circuits in which signals are produced by a feedback loop, such as voltage regulators and bandgap circuits.

The feedback loop includes a feedback (fb) circuitry 14 arranged on a feedback path that generates, converts, or otherwise derives a feedback voltage Vfb from the monitored voltage Vmon. The feedback (fb) circuitry 14 receives the monitored voltage Vmon at its input terminal and outputs the feedback voltage Vfb at its output terminal. The feedback (fb) circuitry 14 extracts a voltage Vfb=βVmon from the monitored voltage Vmon of the second gain stage 12, where β is a function of the feedback (fb) circuitry 14 and may be referred to as a feedback ratio.

The first gain stage 10 may be a high gain device such as a negative-feedback amplifier comprising two input terminals and one output terminal. As a more specific example, the first gain stage 10 may be an operational amplifier (op amp). One input terminal (e.g., an inverting input) of the first gain stage 10 is configured to receive the feedback voltage Vfb, while the other input terminal (e.g., a non-inverting input) is configured to receive a reference voltage Vref3. The first gain stage 10 generates an amplifier voltage VA based on the feedback voltage Vfb and the reference voltage Vref3.

For example, if the feedback voltage Vfb is greater than the reference voltage Vref3, the first gain stage 10 generates the amplifier voltage VA by amplifying the feedback voltage Vfb according to its gain A1. However, because the feedback voltage Vfb is greater than the reference voltage Vref3, the amplifier voltage VA becomes more negative and moves towards the negative supply voltage V− (e.g., ground or 0V) supplied to the first gain stage 10. Similarly, if the feedback voltage Vfb is less than the reference voltage Vref3, the first gain stage 10 generates the amplifier voltage VA by amplifying the feedback voltage Vfb according to its gain A1. However, because the feedback voltage Vfb is less than the reference voltage Vref3, the amplifier voltage VA becomes more positive and moves towards the positive supply voltage V+ (e.g., VDD) supplied to the first gain stage 10.

As a result of the negative feedback loop and the high gain A1 of the first gain stage 10, a small change at the monitored voltage Vmon leads to a large change at the output of the first gain stage 10 (i.e., at the amplifier voltage VA). The high gain A1 of the first gain stage 10 may be designed to drive the amplifier voltage VA to the positive supply voltage V+ (e.g., VDD) or to the negative supply voltage V− (e.g., ground or 0V) in response to any deviation in the monitored voltage Vmon from a predetermined value or from a predetermined range.

A window comparator circuit is electrically connected to a monitoring node Nmon that is located between (in some cases directly between) the output of the first gain stage 10 and a terminal of the second gain stage 12. As such, the amplifier voltage VA is received by the second gain stage 12 and is used to generate the monitored voltage Vmon. The second gain stage 12 may be a high ohmic regulation device, such as a transistor. The second gain stage 12 may be a pass device whose gain A2 is one or substantially one. The second gain stage 12 may be a power device, such as a power transistor that conducts a load current supplied to a node. In the case where the second gain stage 12 is a transistor, the terminal at which the amplifier voltage VA is received and is coupled to the monitoring node Nmon may be a control terminal, such as a gate terminal, and the amplifier voltage VA may be a gate voltage (i.e., a control voltage) of the second gain stage 12 that regulates the current flowing through the second gain stage 12 (e.g., through the transistor).

The window comparator circuit includes two comparators 16 and 18 that are used to define a tolerance window to which the amplifier voltage VA is compared. For example, the tolerance window is defined by an upper reference value defined by a reference voltage Vref1 and a lower reference value defined by a reference voltage Vref2. The reference voltages Vref1, Vref1, and Vref3 are fixed at predetermined values. It will be appreciated that a single comparator (i.e., comparator 16 or 18) could be used instead of a window comparator if it is desired to only monitor for an overvoltage via comparator 16 or an undervoltage via comparator 18.

Comparator 16 is configured to receive both the reference voltage Vref1 and the amplifier voltage VA at its two inputs and generate an error signal (e.g., an error voltage) Verr1 in response to the amplifier voltage VA being greater than the reference voltage Vref1. For example, the comparator 16 may be configured to generate a low voltage value, indicating no error is present at the monitored voltage Vmon, when the amplifier voltage VA is equal to or less than the reference voltage Vref1. In contrast, the comparator 16 may be configured to generate a high voltage value Verr1, indicating an error is present at the monitored voltage Vmon, when the amplifier voltage VA is greater than the reference voltage Vref1. Thus, comparator 16 may be regarded as an overvoltage comparator.

Comparator 18 is configured to receive both the reference voltage Vref2 and the amplifier voltage VA at its two inputs and generate an error signal (e.g., an error voltage) Verr2 in response to the amplifier voltage VA being less than the reference voltage Vref2. For example, the comparator 18 may be configured to generate a low voltage value, indicating no error is present at the monitored voltage Vmon, when the amplifier voltage VA is equal to or greater than the reference voltage Vref2. In contrast, the comparator 18 may be configured to generate a high voltage value Verr2, indicating an error is present at the monitored voltage Vmon, when the amplifier voltage VA is less than the reference voltage Vref2. Thus, comparator 18 may be regarded as an under-voltage comparator.

As noted above, a small change at the monitored voltage Vmon results in a large change at the amplifier voltage VA. The high gain A1 of the first gain stage 10 may be designed to drive the amplifier voltage VA to the positive supply voltage V+ or to the negative supply voltage V− (e.g., ground) in response to a deviation in the monitored voltage Vmon from a predetermined, target value. The deviation may be "any" deviation from the predetermined, target value or may be a deviation of a predetermined amount from the predetermined, target value. The reference voltages Vref1 and Vref2 of the window comparator circuit are set to be within the limits of the supply voltages V+ and V−. In other words, reference voltage Vref1 is set to be less than supply voltage V+ and reference voltage Vref2 is set to be greater than supply voltage V−.

As a result, a deviation in the monitored voltage Vmon from a predetermined, target value causes the first stage amplifier 10 to drive the amplifier voltage VA to a saturated value of either V+ or V− that exceeds the limits of the tolerance window defined the reference voltages Vref1 and Vref2, thereby causing one of the error signals Verr1 or Verr2 to be generated. As such, the window comparator circuit is configured to monitor the monitored signal Vmon indirectly via the amplifier signal VA.

As can be appreciated, the monitored voltage Vmon is changed only by a slight amount, but due to the high open loop gain of the first gain stage 10 (e.g., an op amp), the amplifier voltage VA signal changes significantly. The comparators 16 and 18 of the window comparator circuit that check the changes of the amplifier voltage VA can have much more relaxed accuracy requirements. In other words, while two comparators are still used for window tolerance monitoring, they are much smaller in area due to their relaxed accuracy requirements.

Also, the error is detected while the monitored signal Vmon is still fully in specification of an acceptable tolerance window (i.e., before it has entered a gray zone). In other words, while the monitored signal Vmon may have deviated from a predetermined value that may be regarded as an optimum value or a target value, the monitored signal Vmon may still be within acceptable operating limits for the system as a whole. Nevertheless, the error indication by either error signal Verr1 or Verr2 may provide a pre-indicator or pre-warning that either continued monitoring is needed to ensure that the monitored signal Vmon does not fall outside of acceptable operating limits and/or that additional monitoring and fault detection measures are to be activated to perform additional monitoring of the monitored signal Vmon or its system circuitry.

Figure 2A:
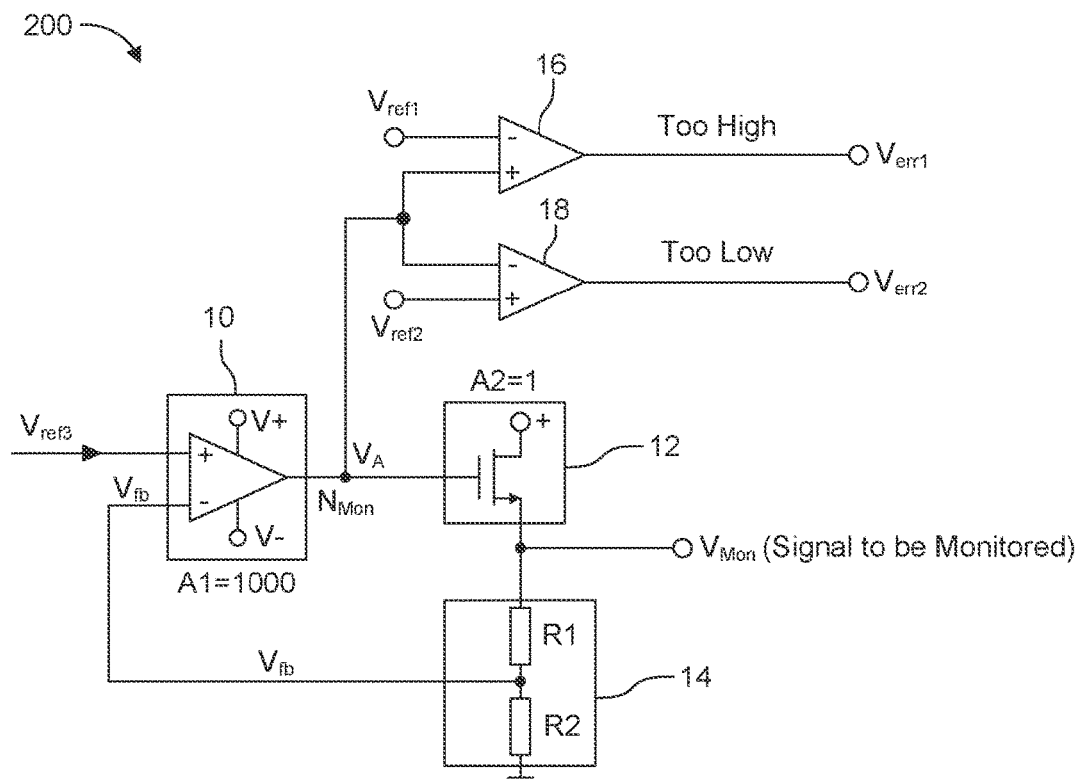
FIG. 2A is a schematic diagram of a signal monitoring circuit according to one or more embodiments.
Figure 2B:
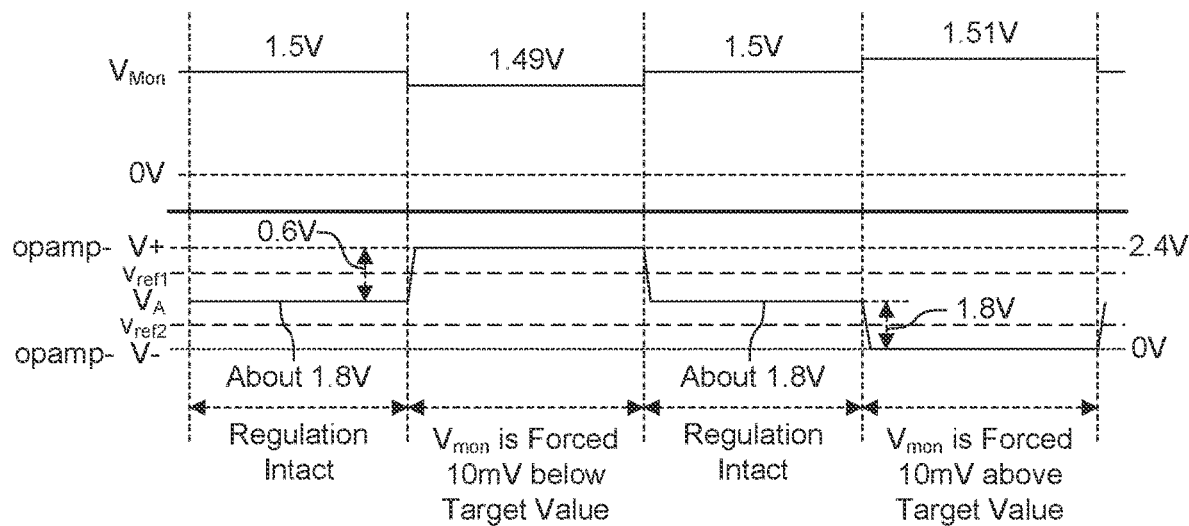
FIG. 2B shows signal diagrams of various voltages taken within the signal monitoring circuit of FIG. 2A.

FIG. 2A is a schematic diagram of a signal monitoring circuit 200 according to one or more embodiments. FIG. 2B shows signal diagrams of various voltages taken within the signal monitoring circuit 200. Specifically, FIG. 2A shows a voltage regulator circuit with the first gain stage 10 as an op amp with a gain A1 of 1000 and a reference voltage Vref3 of 1.2V. FIG. 2A also shows the second gain stage 12 as a transistor with a gain A2 of 1 that outputs the monitored voltage Vmon at 1.5V under optimal conditions and at 1.49V when a leakage current may present due to a defect that causes the voltage to drop slightly. It will be appreciated that the monitored voltage Vmon may also increase from 1.5V due to another type of defect. The feedback circuit 14 is a voltage divider comprising two resistors R1 and R2 that generate the feedback voltage Vfb based on the monitored voltage Vmon. In this example, the references voltages Vref1 and Vref2 of the window comparator circuit are set to 2.1V and 0.9V respectively. The supply voltages V+ and V− of the op amp 10 are set to 2.4V and 0V, respectively. It will be appreciated that the aforementioned values are for illustrative purposes and are by no way intended to be limiting.

FIG. 2B shows monitored voltage Vmon as the monitored signal as it fluctuates from 1.5V to 1.49V and 1.51V. In addition, FIG. 2B shows the effect on amplifier voltage VA as a result of the value at the monitored voltage Vmon. In particular, when the monitored voltage Vmon is at its target regulated value of 1.5V, the amplifier voltage VA is about 1.8V and is clearly within the bounds defined by reference voltages Vref1 and Vref2. However, when the monitored voltage Vmon drifts to 1.49V, the change causes the amplifier voltage VA to be driven to 2.4V (i.e., the supply voltage V+ of the op amp 10), which exceeds (i.e., is greater than) the reference voltage Vref1. On the other hand, when the monitored voltage drifts to 1.51V, the change causes the amplifier voltage VA to be driven to 0V (i.e., the supply voltage V− of the op amp 10), which exceeds (i.e., is less than) the reference voltage Vref2.

When the monitored voltage Vmon is reduced by (for example) 10 mV by a defect on the die, then the feedback voltage drops by 8 mV via the resistive divider. The op amp 10 now sees a differential input voltage of 8 mV across its inputs. If its gain is for example 1000, this 8 mV will lead to a voltage change at VA of 8V. In other words, VA will hit the supply voltage V+ of the op amp 10 due to saturation. Similarly, if the monitored voltage Vmon is forced up by 10 mV, the op amp 10 will try to correct that and if it cannot the voltage VA will hit ground.

As can be seen, the monitored voltage Vmon is force-changed only by a slight amount, but due to the high open loop gain of the op amp 10, the amplifier voltage VA signal changes significantly. The comparators 16 and 18 that check the changes of the amplifier voltage VA can have much more relaxed accuracy requirements (the dotted lines in FIG. 2B are the optimum comparator thresholds for upper and lower violation, respectively) than if they were monitoring the monitored voltage Vmon directly. Also, the defect is detected while the monitored signal is still fully in specification where it is still within bounds of its critical lower and upper limits that define a boundary of respective gray zones (e.g., it is 1.49V, but the critical lower limit for Vmon may be 1.35V). As a result of the monitoring, entering a gray zone by the monitored voltage Vmon can be prevented by early error detection even when employing relaxed accuracy requirements of the comparators 16 and 18.

Figure 3:
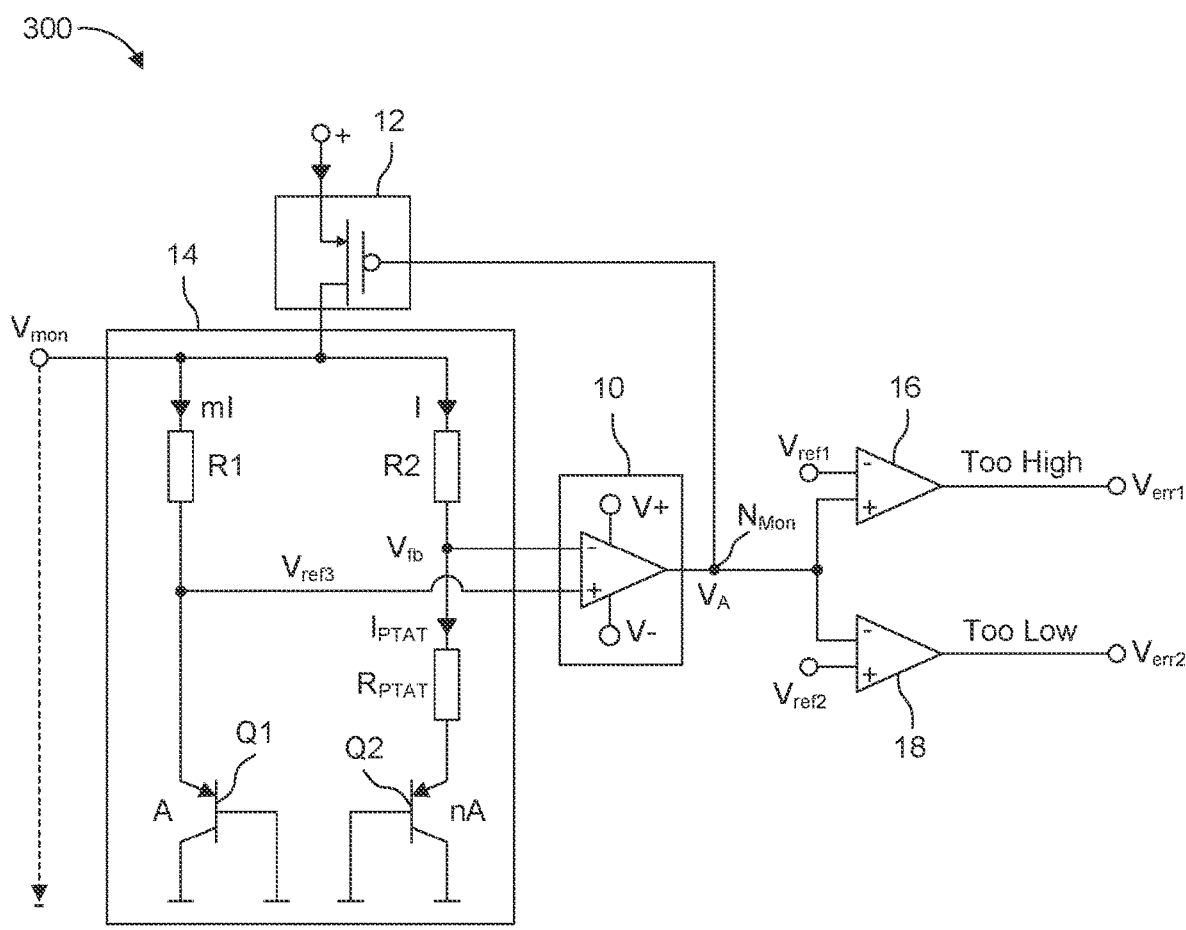
FIG. 3 is a schematic diagram of a signal monitoring circuit according to one or more embodiments.

FIG. 3 is a schematic diagram of a signal monitoring circuit 300 according to one or more embodiments. Specifically, FIG. 3 shows a bandgap voltage reference circuit 300 that produces a fixed bandgap voltage (i.e., the monitored voltage Vmon) regardless of power supply variations, temperature changes, and circuit loading from a device. The bandgap voltage reference circuit 300 includes the first gain stage 10 as an op amp with a gain A1 of 1000 that receives a reference voltage Vref3 at its non-inverting terminal and a feedback voltage Vfb at its inverting terminal. The op amp is again configured as a negative feedback amplifier. FIG. 3 also shows the second gain stage 12 as a transistor with a gain A2 of 1 that outputs the monitored voltage Vmon at a target voltage. The monitored voltage Vmon may deviate from the target voltage possibly due to a defect present in the circuit.

The feedback circuit 14 is a remaining portion of the bandgap voltage reference circuit 300, including resistors R1 and R2 that conduct currents mI and I, respectively, where "m" is a multiplier coefficient. The feedback circuit 14 further includes a proportional to absolute temperature (PTAT) resistor $R_{PTAT}$ that conducts a PTAT current $I_{PTAT}$. Each parallel branch of the feedback circuit 14 includes a transistor Q1 and Q2, where transistor Q2 has an emitter area nA that is "n" times larger than an emitter area A of transistor Q1.

The bandgap voltage reference circuit 300 further includes a window comparator comprising comparators 16 and 18 that operate in a similar manner described above. Namely, the comparators 16 and 18 receive the amplifier voltage VA that is output from the first gain stage 10 and generate error voltages Verr1 and Verr2 based on a comparison result of the amplifier voltage VA against the reference voltages Vref1 and Vref2.

A deviation of the monitored voltage Vmon away from its target voltage results is a large change at the amplifier voltage VA, and more specifically, results in driving the amplifier voltage VA to one of the op amp supply voltages V+ or V−. The reference voltages Vref1 and Vref2 are preconfigured such that the op amp supply voltages V+ or V− are outside their defined window. As a result, driving the amplifier voltage VA to one of the op amp supply voltages V+ or V− triggers one of the error signals Verr1 or Verr2. As noted above, the error signals Verr1 and Verr2 may serve as pre-indicators that further monitoring action is needed to prevent the monitored voltage Vmon from deviating outside a critical range (i.e., to prevent Vmon from entering a gray zone). As a result of the monitoring, entering a gray zone by the monitored voltage Vmon can be prevented by early error detection even when employing relaxed accuracy requirements of the comparators 16 and 18.

The comparators 16 and 18 that check the changes of the amplifier voltage VA can have much more relaxed accuracy requirements than if they were monitoring the monitored voltage Vmon directly. Also, the defect is detected while the monitored signal is still fully in specification where it is still within bounds of its critical lower and upper limits. That is, it has not entered a gray zone.

While various embodiments have been described, it will be apparent to those of ordinary skill in the art that many more embodiments and implementations are possible within the scope of the disclosure. Accordingly, the invention is not to be restricted except in light of the attached claims and their equivalents.

With regard to the various functions performed by the components or structures described above (assemblies, devices, circuits, systems, etc.), the terms (including a reference to a "means") used to describe such components are intended to correspond, unless otherwise indicated, to any component or structure that performs the specified function of the described component (i.e., that is functionally equivalent), even if not structurally equivalent to the disclosed structure that performs the function in the exemplary implementations of the invention illustrated herein.

Furthermore, the following claims are hereby incorporated into the detailed description, where each claim may stand on its own as a separate example embodiment. While each claim may stand on its own as a separate example embodiment, it is to be noted that—although a dependent claim may refer in the claims to a specific combination with one or more other claims—other example embodiments may also include a combination of the dependent claim with the subject matter of each other dependent or independent claim. Such combinations are proposed herein unless it is stated that a specific combination is not intended. Furthermore, it is intended to include also features of a claim to any other independent claim even if this claim is not directly made dependent to the independent claim.

It is further to be noted that methods disclosed in the specification or in the claims may be implemented by a device having means for performing each of the respective acts of these methods.

Further, it is to be understood that the disclosure of multiple acts or functions disclosed in the specification or in the claims may not be construed as to be within the specific order. Therefore, the disclosure of multiple acts or functions will not limit these to a particular order unless such acts or functions are not interchangeable for technical reasons. Furthermore, in some embodiments a single act may include or may be broken into multiple sub acts. Such sub acts may be included and part of the disclosure of this single act unless explicitly excluded.

In summary, although various exemplary embodiments have been disclosed, it will be apparent to those skilled in the art that various changes and modifications can be made which will achieve some of the advantages of the concepts disclosed herein without departing from the spirit and scope of the invention. It will be obvious to those reasonably skilled in the art that other components performing the same functions may be suitably substituted. It is to be understood that other embodiments may be utilized, and structural or logical changes may be made without departing from the scope of the present invention. It should be mentioned that features explained with reference to a specific figure may be combined with features of other figures, even in those not explicitly mentioned. Such modifications to the general inventive concept are intended to be covered by the appended claims and their legal equivalents.

What is claimed is:

1. A gray zone prevention circuit, comprising:
   a first gain stage circuit comprising a first input terminal and a first output terminal, wherein the first gain stage circuit amplifies a feedback signal received at the first input terminal and generates an amplified signal at the first output terminal;
   a second gain stage circuit comprising a terminal and a second output terminal, wherein the terminal is coupled to the first output terminal for receiving the amplified signal, and wherein the second gain stage circuit is configured to generate a monitored signal at the second output terminal based on the amplified signal;
   a feedback circuit coupled between the second output terminal and the first input terminal and configured to convert the monitored signal into the feedback signal; and
   a comparator circuit comprising a monitoring node coupled to the first output terminal for receiving the amplified signal, wherein the comparator circuit is configured to monitor the monitored signal indirectly via the amplified signal,
   wherein the second gain stage circuit is configured to generate the monitored signal at a target value,
   wherein the comparator circuit comprises at least one of a first comparator or a second comparator,
   wherein the first comparator is configured to generate a first error signal in response to the monitored signal being greater than the target value, and
   wherein the second comparator is configured to generate a second error signal in response to the monitored signal being less than the target value.

2. The gray zone prevention circuit of claim 1, wherein:
   the first gain stage circuit employs a first gain to amplify the feedback signal to generate the amplified signal,
   the second gain stage circuit employs a second gain to generate the monitored signal, and
   the first gain being greater than the second gain.

3. The gray zone prevention circuit of claim 1, wherein:
   the comparator circuit is a window comparator circuit comprising the first comparator and the second comparator,
   the first comparator is configured to generate the first error signal in response to the monitored signal being greater than the target value by a first predetermined amount, and
   the second comparator is configured to generate the second error signal in response to the monitored signal being less than the target value by a second predetermined amount.

4. The gray zone prevention circuit of claim 3, wherein the feedback circuit is arranged on a negative feedback path that extends between the second output terminal and the first input terminal.

5. The gray zone prevention circuit of claim 4, wherein:
   the first gain stage circuit is an operational amplifier configured to be supplied with a first supply potential and a second supply potential,
   the first gain stage circuit is configured to employ a first gain to amplify the feedback signal to generate the amplified signal,
   the first gain being sufficient to drive the amplified signal to the first supply potential in response to the monitored signal being less than the target value by the second predetermined amount, and
   the first gain being sufficient to drive the amplified signal to the second supply potential in response to the monitored signal being greater than the target value by the first predetermined amount.

6. The gray zone prevention circuit of claim 5, wherein the second gain stage circuit is a transistor and the terminal of the second gain stage circuit that receives the amplified signal is a control terminal of the transistor.

7. The gray zone prevention circuit of claim 6, wherein the monitoring node is coupled to the control terminal.

8. The gray zone prevention circuit of claim 5, wherein the second gain stage circuit is a high ohmic regulation device.

9. The gray zone prevention circuit of claim 5, wherein the second supply potential is a ground potential.

10. The gray zone prevention circuit of claim 5, wherein:
the first comparator comprises a first comparator input configured to receive a first reference value and second comparator input configured to receive the amplified signal, and the first comparator is configured to generate the first error signal on a condition that a value of the amplified signal is greater than the first reference value, and
the second comparator comprises a third comparator input configured to receive a second reference value and fourth comparator input configured to receive the amplified signal, and the second comparator is configured to generate the second error signal on a condition that a value of the amplified signal is less than the second reference value.

11. The gray zone prevention circuit of claim 10, wherein:
the first reference value is greater than the second reference value and is less than the first supply potential of the operational amplifier, and
the second reference value is greater than the second supply potential of the operational amplifier.

12. The gray zone prevention circuit of claim 3, wherein:
the first comparator comprises a first comparator input configured to receive a first reference value and second comparator input configured to receive the amplified signal, and the first comparator is configured to generate the first error signal on a condition that a value of the amplified signal is greater than the first reference value, and
the second comparator comprises a third comparator input configured to receive a second reference value and fourth comparator input configured to receive the amplified signal, and the second comparator is configured to generate the second error signal on a condition that a value of the amplified signal is less than the second reference value.

13. The gray zone prevention circuit of claim 1, wherein:
the first gain stage circuit is an operational amplifier configured to be supplied with a first supply potential and a second supply potential,
the first gain stage circuit is configured to employ a first gain to amplify the feedback signal to generate the amplified signal,
the first gain being sufficient to drive the amplified signal to the second supply potential in response to the monitored signal being greater than the target value by a first predetermined amount, and
the first gain being sufficient to drive the amplified signal to the first supply potential in response to the monitored signal being less than the target value by a second predetermined amount.

14. The gray zone prevention circuit of claim 1, wherein:
the comparator circuit is a window comparator circuit comprising the first comparator and the second comparator.

15. The gray zone prevention circuit of claim 1, further comprising:
a feedback loop comprising the feedback circuit and the first gain stage circuit, wherein the feedback loop is configured to regulate the monitored signal.

16. The gray zone prevention circuit of claim 1, wherein the feedback circuit is a resistive voltage divider.

17. The gray zone prevention circuit of claim 1, wherein the feedback circuit is part of a bandgap voltage reference circuit.

18. A gray zone prevention circuit, comprising:
a first gain stage circuit comprising a first input terminal and a first output terminal, wherein the first gain stage circuit amplifies a feedback signal received at the first input terminal and generates an amplified signal at the first output terminal;
a second gain stage circuit comprising a terminal and a second output terminal, wherein the terminal is coupled to the first output terminal for receiving the amplified signal, and wherein the second gain stage circuit is configured to generate a monitored signal at the second output terminal based on the amplified signal;
a feedback circuit coupled between the second output terminal and the first input terminal and configured to convert the monitored signal into the feedback signal; and
a comparator circuit comprising a monitoring node coupled to the first output terminal for receiving the amplified signal, wherein the comparator circuit is configured to monitor the monitored signal indirectly via the amplified signal,
wherein the first gain stage circuit is supplied with a first supply potential and a second supply potential,
wherein the first gain stage circuit is configured to employ a first gain to amplify the feedback signal to generate the amplified signal,
wherein the first gain being sufficient to drive the amplified signal to the second supply potential in response to the monitored signal being greater than a target value by a first predetermined amount, and
wherein the first gain being sufficient to drive the amplified signal to the first supply potential in response to the monitored signal being less than the target value by a second predetermined amount.

19. The gray zone prevention circuit of claim 18, wherein:
the second gain stage circuit employs a second gain to generate the monitored signal, and
the first gain is at least two orders of magnitude greater than the second gain.

20. A method of preventing a monitored signal from entering a gray zone, the method comprising:
amplifying, by a first gain stage circuit, a feedback signal in order to generate an amplified signal;
generating, by a second gain stage circuit, the monitored signal at a target value based on the amplified signal;
converting, by a feedback circuit, the monitored signal into the feedback signal to be provided to the first gain stage circuit; and
monitoring, by a comparator circuit, the monitored signal indirectly via the amplified signal, including generating a first error signal in response to the monitored signal being greater than the target value or generating a second error signal in response to the monitored signal being less than the target value.

* * * * *